(12) United States Patent
Onushkin et al.

(10) Patent No.: US 8,754,578 B2
(45) Date of Patent: *Jun. 17, 2014

(54) AC DRIVEN LIGHT EMITTING DEVICE CONNECTION STRUCTURE

(75) Inventors: Grigory Onushkin, Gyunggi-do (KR); Gil Han Park, Gyunggi-do (KR); Jung Ja Yang, Gyunggi-do (KR); Young Jin Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/482,781

(22) Filed: May 29, 2012

(65) Prior Publication Data

US 2012/0235584 A1    Sep. 20, 2012

Related U.S. Application Data

(60) Continuation of application No. 13/237,564, filed on Sep. 20, 2011, now Pat. No. 8,188,654, which is a division of application No. 12/265,357, filed on Nov. 5, 2008, now Pat. No. 8,040,050.

(30) Foreign Application Priority Data

Jun. 30, 2008  (KR) ........................ 10-2008-0063127

(51) Int. Cl.
*H05B 33/02*    (2006.01)
*H01L 27/15*    (2006.01)

(52) U.S. Cl.
CPC .................................... *H01L 27/156* (2013.01)
USPC ........................................................ 313/504

(58) Field of Classification Search
CPC ....................................................... H01L 33/62
USPC .................................................. 313/504–505
See application file for complete search history.

(56) References Cited

U.S. PATENT DOCUMENTS 7,138,770 B2    11/2006  Uang et al.
7,210,819 B2    5/2007   Jiang et al.
(Continued)

FOREIGN PATENT DOCUMENTS

JP    08-008069 A    1/1996
JP    2004-006582 A  1/2004
(Continued)

OTHER PUBLICATIONS

Japanese Office Action, w/English translation thereof, issued in Japanese Patent Applicaition No. JP 2008-291548 dated Jun. 7, 2011, In parent U.S. Appl. No. 12/265,357.
(Continued)

*Primary Examiner* — Anh Mai
*Assistant Examiner* — Hana Featherly
(74) *Attorney, Agent, or Firm* — McDermott Will & Emery LLP

(57) ABSTRACT

An alternating current (AC) driven light emitting device includes a substrate, K number of first light emitting diode (LED) cells arranged in a row on a top surface of the substrate, where K is an integer satisfying K≥3, K number of second LED cells arranged in a row parallel to the row of the first LED cells on the top surface of the substrate, and (K−1) number of third LED cells arranged in a row between the respective rows of the first and second LED cells on the top surface of the substrate. The AC driven light emitting device has a connection structure between LED cells to be operable at an AC.

18 Claims, 7 Drawing Sheets

(56) References Cited

U.S. PATENT DOCUMENTS

| | | |
|---|---|---|
| 7,544,524 B2 | 6/2009 | Lin et al. |
| 2004/0080941 A1 | 4/2004 | Jiang et al. |
| 2005/0253151 A1 | 11/2005 | Sakai et al. |
| 2006/0006406 A1 | 1/2006 | Kim et al. |
| 2006/0044864 A1 | 3/2006 | Lin et al. |
| 2006/0256826 A1 | 11/2006 | Lin et al. |
| 2007/0103899 A1 | 5/2007 | Takikawa |
| 2007/0216322 A1 | 9/2007 | Kim |
| 2008/0315789 A1 | 12/2008 | Lee et al. |

FOREIGN PATENT DOCUMENTS

| | | |
|---|---|---|
| JP | 2006-319333 A | 11/2006 |
| JP | 2007-123609 A | 5/2007 |
| KR | 10-2006-0002401 A | 1/2006 |
| KR | 10-2006-0020572 A | 3/2006 |
| KR | 10-2006-0028009 A | 3/2006 |
| KR | 10-2006-0089324 A | 8/2006 |
| KR | 10-2007-0093761 A | 9/2007 |
| KR | 10-0843402 | 7/2008 |
| WO | WO 2004/023568 A1 | 3/2004 |

OTHER PUBLICATIONS

Korean Office Action, w/ English translation thereof, issued in Korean Patent Application No. KR 10-2008-0063127 dated Apr. 20, 2010, In parent U.S. Appl. No. 12/265,357.

Korean Notice of Allowance issued in Korean Patent Application No. KR 10-2010-0102599 dated Jan. 28, 2014.

US 8,754,578 B2

AC DRIVEN LIGHT EMITTING DEVICE CONNECTION STRUCTURE

CROSS-REFERENCE TO RELATED APPLICATIONS

This application is a Continuation of U.S. application Ser. No. 13/237,564, filed on Sep. 20, 2011 now U.S. Pat. No. 8,188,654, which is a Divisional of U.S. application Ser. No. 12/265,357, now U.S. Pat. No. 8,040,050, filed on Nov. 5, 2008, which claims the priority of Korean Patent Application No. 2008-63127 filed on Jun. 30, 2008, in the Korean Intellectual Property Office, the disclosures of each of which are incorporated herein by reference.

BACKGROUND OF THE INVENTION

1. Field of the Invention

The present invention relates to an alternating current (AC) driving light emitting device, and more particularly, to an AC driven light emitting device operable directly from AC power without requiring an AC-DC converter.

2. Description of the Related Art

A semiconductor light emitting diode (LED) is advantageous as a light source in terms of output, efficiency or reliability. Thus, the semiconductor LED is actively studied and developed as a high-output, high-efficiency light source to substitute a backlight of an illumination device or a display device.

In general, the LED is driven at a low direct current (DC). Therefore, to be driven at a normal voltage of, e.g., AC 220V, the LED requires an additional circuit such as an AC/DC converter for supplying a low DC output voltage. However, the additional circuit complicates the configuration of an LED module and may undermine efficiency and reliability when supply power is converted. Also, the additional part other than the light source increases costs and size of a product and degrades electromagnetic interference (EMI) characteristic because of a periodic component during an operation in a switching mode.

To overcome this limitation, various types of LED driving circuits, which can be driven directly at an AC voltage without using a converter, have been suggested. However, in a related art AC driven LED driving circuit, most LEDs are arranged to operate only in a specific half cycle of an AC voltage, thereby significantly increasing the number of LEDs needed for obtaining the desired quantity of light.

The necessary number of LEDs may be varied according to arrangement of the LEDs even though identical quality of light is provided. However, the related art arrangement of LEDs has very low efficiency. For example, in a representative example where the LEDs are in a reverse-parallel or bridge arrangement, the actual number of LEDs continuously emitting light is merely 50% to 60% of the total number of LEDs. That is, many LEDs are inefficiently used to attain a desired light-emission level.

Therefore, the LEDs need to be more efficiently arranged to provide equal quality of light through a smaller number of LEDs. The arrangement for improved efficiency is significantly important in terms of cost efficiency in manufacturing and selling the AC driven LED circuit.

In an actual AC driven light emitting device, unit LED cells may be connected with one another with great complexity. Thus, the interconnections and processes for forming them may be complicated and less productive. Because of the complicated interconnections between the plurality of LED cells, it is also important to design a light emitting device to be miniaturized with a high degree of integration.

SUMMARY OF THE INVENTION

An aspect of the present invention provides an excellent AC driven light emitting device, which has a connection structure allowing operation at an AC voltage while optimizing interconnection and arrangement of LED cells for a high degree of integration.

According to an aspect of the present invention, there is provided an alternating current (AC) driven light emitting device including: a substrate; K number of first light emitting diode (LED) cells arranged in a row on a top surface of the substrate, where K is an integer satisfying K≥3; K number of second LED cells arranged in a row parallel to the row of the first LED cells on the top surface of the substrate; and (K−1) number of third LED cells arranged in a row between the respective rows of the first and second LED cells on the top surface of the substrate.

The AC driven light emitting device has a connection structure between the LED cells to be operable at an AC.

A first electrode of the $m^{th}$ third LED cell is connected with second electrodes of the $m^{th}$ and $m+1^{th}$ first LED cells, and a second electrode of the $m^{th}$ third LED cell is connected with first electrodes of the $m^{th}$ and $m+1^{th}$ second LED cells, where m is an odd number satisfying m<K.

A first electrode of the $n^{th}$ third LED cell is connected with second electrodes of the $n^{th}$ and $n+1^{th}$ second LED cells, and a second electrode of the nth third LED cell is connected with first electrodes of the $n^{th}$ and $n+1^{th}$ first LED cells, where n is an even number satisfying n<K.

The AC driven light emitting device further includes: a first external electrode connected with a first electrode of the first first LED cell and a second electrode of the first second light LED cell; and a second external electrode connected with electrodes among electrodes of the $K^{th}$ first and second LED cells, which are not in connection with the third LED cell.

First and second electrodes of each of the first to third LED cells may be respectively disposed adjacent to both facing sides on a top surface of a corresponding one of the first to third LED cells, and each may have a portion extending along the corresponding side thereof. Thus, the uniform current distribution is achieved over the entire light emission area of each LED cell, thereby improving the high light emission efficiency.

The substrate may have a top surface having a rectangular shape with first to fourth sides. In this case, the first and second LED cells may be respectively arranged in rows along the first and second sides, the first first and second LED cells may be disposed adjacent to the third side, and the $K^{th}$ first and second LED cells may be disposed adjacent to the fourth side.

To realize the high degree of integration, the third LED cell is arranged adjacent to two first LED cells having connected electrodes therebetween, and two second LED cells having connected electrodes therebetween.

The third LED cell may have a top surface with a parallelogram shape inclined with respect to an arrangement direction thereof.

In order to shorten the electrode interconnection and thus reduce defects, the first and second electrodes of the third LED cell may be respectively disposed adjacent to both inclined sides on the top surface of the third LED cell.

In this case, the first and second electrodes of the first LED cell may be respectively disposed adjacent to both sides on the top surface of the first LED cell, which are perpendicular to an arrangement direction of the first LED cells, and the first and second electrodes of the second LED cell may be respectively disposed adjacent to both sides on the top surface of the second LED cell, which are perpendicular to an arrangement direction of the second LED cells.

The third LED cell may have a top surface having a rough rectangular shape with two facing longer sides and two facing shorter sides.

The first and second electrodes of the third LED cell may be respectively disposed adjacent to the two longer sides of the top surface having the rectangular shape.

The third LED cell may be arranged such that the longer side thereof is almost perpendicular to an arrangement direction of the third LED cells. The first and second electrodes of the first LED cell may be respectively disposed adjacent to both sides on the top surface of the first LED cell, which are parallel to the arrangement direction of the first LED cells. The first and second electrodes of the second LED cell may be disposed adjacent to both sides on the top surface of the second LED cell, which are parallel to the arrangement direction of the second LED cells.

To connect the first and second LED cells with external electrodes with a high degree of integration, the first first LED cell may extend along the third side of the top surface of the substrate to be adjacent to the first second LED cell, and the $K^{th}$ second LED cell may extend along the fourth side of the top surface of the substrate to be adjacent to the $K^{th}$ first LED cell.

In this case, the first external electrode may be placed on the first first LED cell, and the second external electrode may be placed on the $K^{th}$ second LED cell.

To prevent voltage concentration at a specific cell, the first to third LED cells may have almost the same light emission areas.

The first to third LED cells each may be obtained from a first conductivity type semiconductor layer, an active layer and a second conductivity type semiconductor layer which are sequentially grown on the substrate. That is, desired arrangements of the first to third LED cells may be obtained by isolating the first conductivity semiconductor layer, the active layer and the second conductivity type semiconductor layer, which are grown on the entire top surface of the substrate for a light emission structure, in units of cells using an appropriate isolation process.

The isolation process may be categorized into a full-isolation process for exposure up to a substrate or a half-isolation process of exposure only up to the first conductivity type semiconductor layer.

For example, at least one pair of the $m^{th}$ and $m+1^{th}$ second LED cells may be isolated from each other by an exposed region of the first conductivity type semiconductor layer, and share one first electrode disposed in the exposed region of the first conductivity type semiconductor layer.

Similarly, at least one pair of the $n^{th}$ and $n+1^{th}$ first LED cells may be isolated from each other by an exposed region of the first conductivity type semiconductor layer, and share one first electrode disposed in the exposed region of the first conductivity type semiconductor layer.

As the half-isolation process is applied to a specific cell and the first electrode is shared, a process can be simplified and the degree of integration can be improved.

Every pair of the $m^{th}$ and $m+1^{th}$ second LED cells may be isolated from each other by an exposed region of the first conductivity type semiconductor layer, and share one first electrode disposed in the exposed region of the first conductivity type semiconductor layer. Every pair of the $n^{th}$ and $n+1^{th}$ first LED cells may be isolated from each other by an exposed region of the first conductivity type semiconductor layer, and share one first electrode disposed in the exposed region of the first conductivity type semiconductor layer. Other remaining first to third LED cells may be isolated by exposed regions of the substrate.

All the first to third LED cells may be isolated from another adjacent LED cell by an exposed region of the substrate (i.e., by the full-isolation process).

According to another aspect of the present invention, there is provided an alternating current (AC) driving light emitting device including: a substrate; and first and second ladder network circuit type LED arrays disposed parallel to each other on a top surface of the substrate. Each of the first and second ladder network circuit type LED arrays includes: K number of first LED cells arranged in a row on the top surface of the substrate, where K is an integer satisfying K≥3; K number of second LED cells arranged in a row parallel to the row of the first LED cells on the top surface of the substrate; and (K−1) number of third LED cells arranged in a row between the respective rows of the first and second LED cells on the top surface of the substrate.

The first and second ladder network circuit type LED arrays are arranged such that the respective rows of the second LED cells of the first and second ladder network circuit type LED arrays are adjacent to each other.

A first electrode of the $m^{th}$ third LED cell is connected with second electrodes of the $m^{th}$ and $m+1^{th}$ first LED cells, and a second electrode of the $m^{th}$ third LED cell is connected with first electrodes of the $m^{th}$ and $m+1^{th}$ second LED cells, where m is an integer satisfying m<K. A first electrode of the $n^{th}$ third LED cell is connected with second electrodes of the $n^{th}$ and $n+1^{th}$ second LED cells, and a second electrode of the $n^{th}$ third LED cell is connected with first electrodes of the $n^{th}$ and $n+1^{th}$ first LED cells.

A first electrode of the first first LED cell and a second electrode of the first second LED cell are connected together, and electrodes of the $K^{th}$ first and second LED cells, which are not in connection with the third LED cell, are connected together.

For the connection between the first and second ladder network circuit type LED arrays, electrodes of the $K^{th}$ second LED cell of the first ladder network circuit type LED array and the $K^{th}$ second LED cell of the second ladder network circuit type LED array, which are not in connection with the third LED cell, are connected together.

Each of the first to third LED cells of each of the first and second ladder network circuit type LED arrays may include a first conductivity type semiconductor layer, an active layer and a second conductivity type semiconductor layer sequentially grown on the substrate.

When the K representing the number of the first LED cells and the number of second LED cells in each of the first and second ladder network circuit type LED arrays is an odd number, the $K^{th}$ second LED cell of the first ladder network circuit type LED array and the $K^{th}$ second LED cell of the second ladder network may be isolated from each other by an exposed region of the first conductivity type semiconductor layer, and share one first electrode.

Also, a third ladder network circuit type LED array having a similar configuration as described above may be connected thereto.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
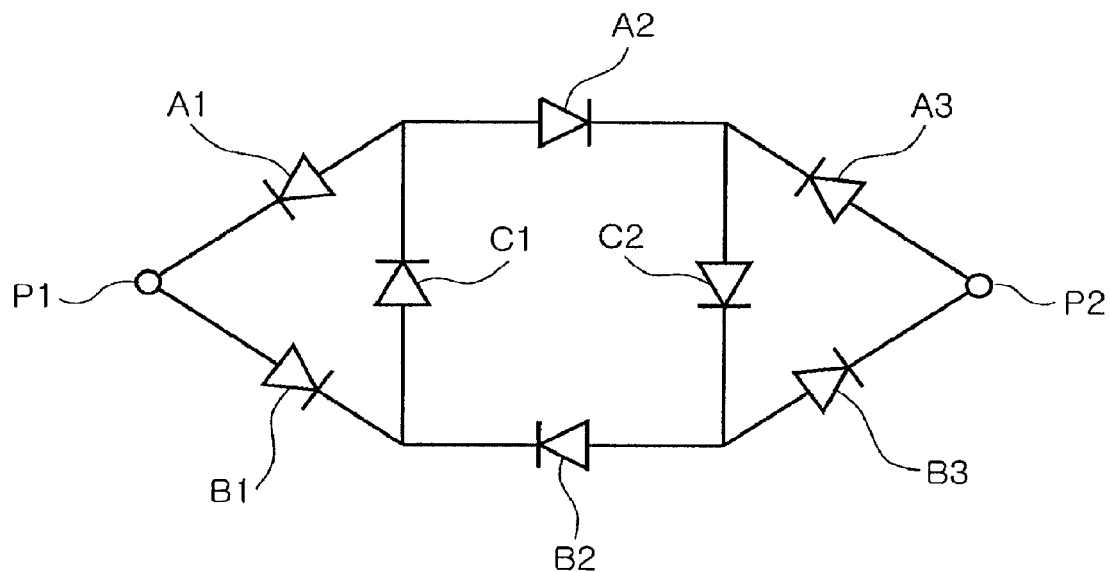
FIG. 1A illustrates a light emitting diode (LED) driving circuit according to an exemplary embodiment (unit arrangement) of the present invention.

FIG. 1A is a light emitting diode (LED) driving circuit according to an exemplary embodiment (unit arrangement) of the present invention.

The LED driving circuit of FIG. 1A includes three first LED cells A1, A2 and A3, three second LED cells B1, B2 and B3, and two third LED cells C1 and C2. The three first LED cells A1, A2 and A3, and the three second LED cells B1, B2 and B3 are connected in parallel to one another between first and second contacts provided as external terminals P1 and P2. The two third LED cells C1 and C2 are respectively connected between a junction point between the first LED cells A1 and A2 and a junction point between the second LED cells B1 and B2 and between a junction point between the first LED cells A2 and A3 and a junction point between the second LED cells B2 and B3.

Electrode connections of the first to third LED cells will now be described. The first third LED cell C1 has a first electrode (−) connected with respective second electrodes (+) of the first and second first LED cells A1 and A2, and a second electrode (+) connected with respective first electrodes (−) of the first and second second LED cells B1 and B2. The second third LED cell C2 has a first electrode (−) connected with respective second electrodes (+) of the second and third second LED cells B2 and B3, and a second electrode (+) connected with respective first electrodes (−) of the second and third first LED cells A2 and A3.

The first contact is connected with a first electrode (−) of the first first LED cell A1 and a second electrode (+) of the first second LED cell B1. The second contact is connected with a second electrode (+) of the third first LED cell A3 and a first electrode of the third second LED cell B3.

The connection structure described above allows the LED driving circuit of FIG. 1A to be driven in different half cycles of an alternating current (AC).

In a first half cycle of the AC current, a group of LED cells B1-C1-A2-C2-B3 connected together in series forms a first current loop. In a second half cycle of the AC voltage, a group of LED cells A3-C2-B2-C1-A1 connected together in series forms a second current loop. Through this operation, the two third LED cells C1 and C2 can be continuously driven over the entire cycle of the AC voltage.

In an actual ladder network circuit, five LED devices may be provided to perform continuous emission. Here, a ratio of the number of driven LEDs to the number of employed LEDs is 62.5% (5/8=62.5%), which is higher than in the case of the related art AC-driven LED arrangement, for example, a reverse-polarity arrangement (50%) or a bridge arrangement (generally 60%).

The present invention provides a layout for implementing a ladder network LED driving circuit as exemplified in FIG. 1A. The layout of LED cells can ensure the high degree of integration and excellent light emission efficiency and simplify the connection between electrodes.

Figure 1B:
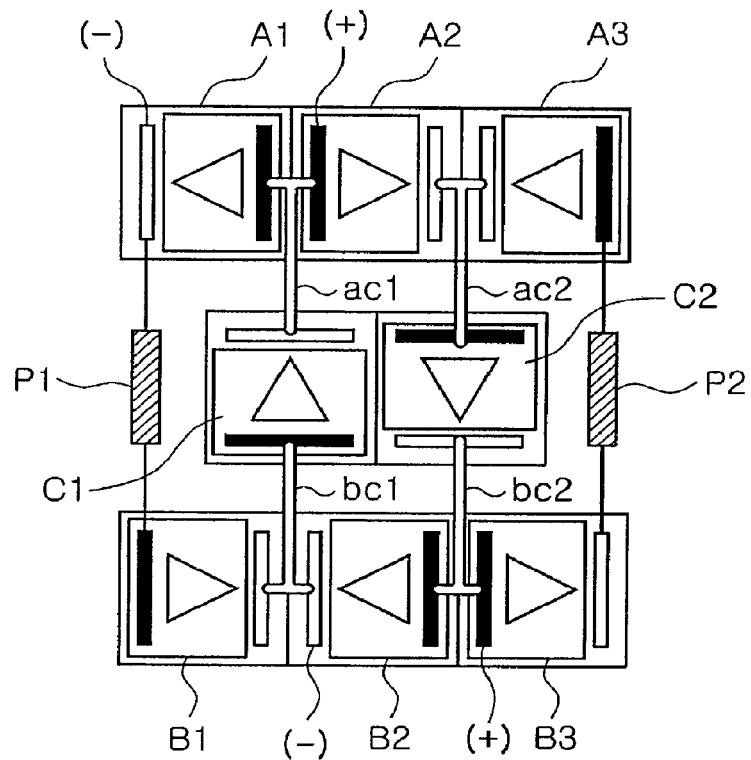
FIG. 1B illustrates arrangement of LED cells for implementation of a light emitting device based on the LED driving circuit of FIG. 1A.

FIG. 1B is a schematic view of one example of the present invention, illustrating a schematic layout of LED cells for implementing the circuit of FIG. 1A as a light emitting device.

Referring to FIG. 1B, three first LED cells A1, A2 and A3a are arranged in a row, and three second LED cells B1, B2 and B3 are arranged in a row parallel to the first LED cells A1, A2 and A3. Two third LED cells C1 and C2 are arranged between the row of the first LED cells A1, A2 and A3 and the row of the second LED cells B1, B2 and B3.

The above arrangement in which the third LED cells C1 and C2 are disposed between the first and second LED cells contribute to achieving a simple implementation of lines ac1, ac2, bc1 and bc2.

As shown in FIG. 1B, the AC driven light emitting device according to the present invention includes lines ac1, bc1, ac2 and bc2. The line ac1 connects the first electrode (−) of the first third LED cell C1 with the respective second electrodes (+) of the first and second first LED cells A1 and A2. The line bc1 connects the second electrode (+) of the first third LED cell C1 with the respective first electrodes (−) of the first and second second LED cells B1 and B2. The line ac2 connects the second electrode (+) of the second third LED cell C2 with the respective first electrodes (−) of the second and third first LED cells A2 and A3. The line bc2 connects the first electrode (−) of the second third LED cell C2 with the respective second electrodes (+) of the second and third second LED cells B2 and B3. The lines between the cells may be configured using known lines such as air-bridges, wires or the like.

Also, the first contact P1 is connected with the first electrode (−) of the first first LED cell A1 and the second electrode (+) of first second LED cell B1. The second contact P2 is connected with the second electrode (+) of the third first LED cell A3 and the first electrode (−) of the third second LED cell B3.

Figure 2:
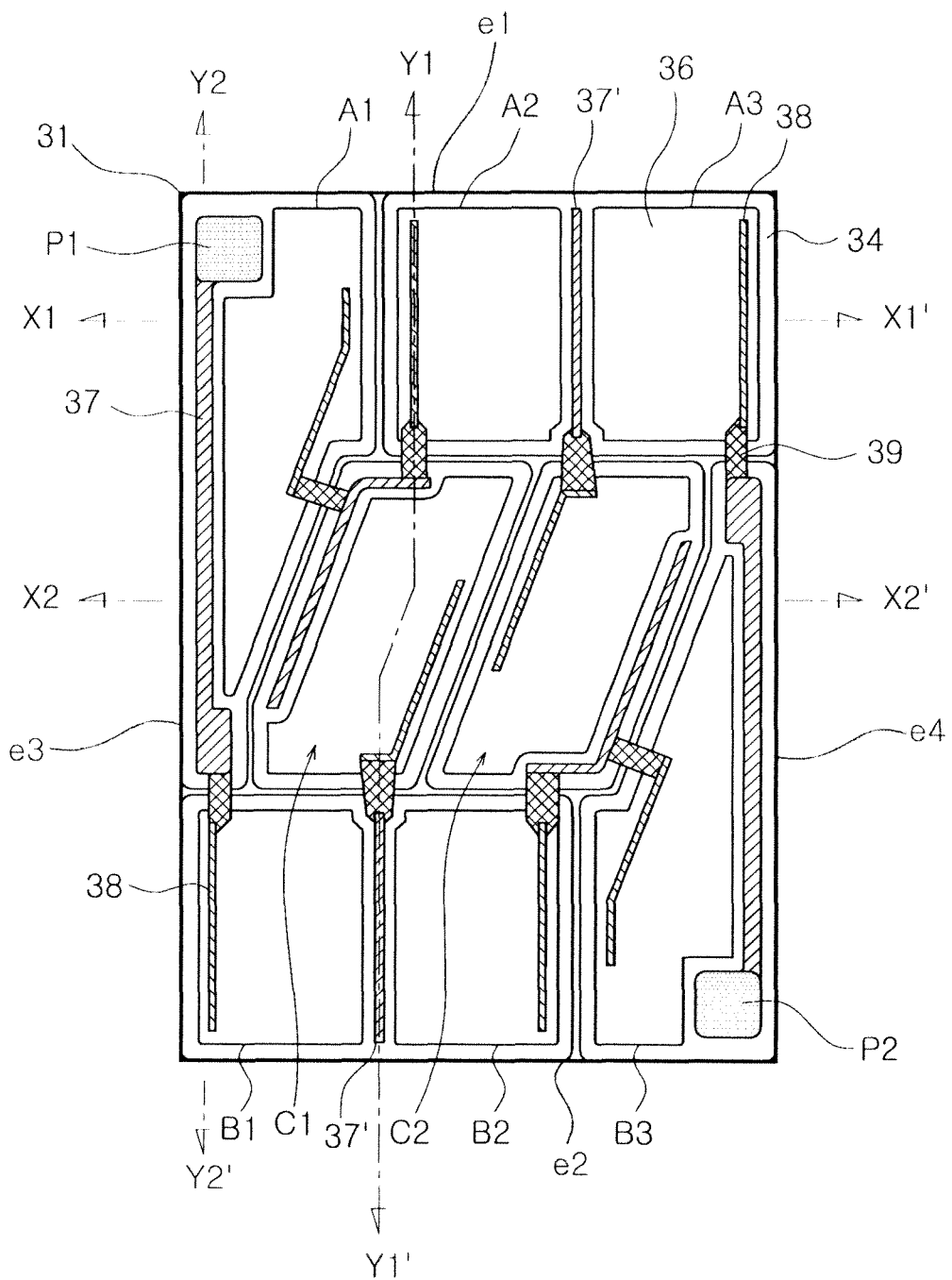
FIG. 2 is a plan view of a light emitting device according to an exemplary embodiment of the present invention.

FIG. 2 is a plan view of a light emitting device according to an exemplary embodiment of the present invention. FIG. 2 may be understood as illustrating a desirable light emitting device, which is an actual implementation of FIG. 1B.

The AC driven light emitting device of FIG. 2 includes a substrate 31 having a rectangular shape with four sides, i.e., first to fourth sides e1 to e4.

Three first LED cells A1, A2 and A3 are arranged in a row along the first side e1 of a top surface of the substrate 31. Three second LED cells B1, B2 and B3 are arranged in a row along the second side e2 facing the first side e1. Two third LED cells C1 and C2 are arranged between the respective rows of the first LED cells A1, A2 and A3 and the second LED cells B1, B2 and B3.

As for the first to third LED cells employed in this embodiment, a first electrode 37 or 37' and a second electrode 38 are respectively disposed adjacent to facing sides of a top surface of a corresponding one of the LED cells. The first and second electrodes 37, 37' and 38 each have a portion extending along the corresponding side adjacent thereto. Since the first electrodes 37 or 37' and the electrodes 38 respectively extend along both opposing sides, uniform current distribution can be obtained over the entire emission area of each LED cell. This can improve light emission efficiency.

According to this embodiment, the first first LED cell A1 may extend up to the first second LED cell B1 along the third side e3 of the top surface of the substrate 31. The third second LED cell B3 may extend up to the third first LED cell A3 along the fourth side e4 of the top surface of the substrate 31. The higher degree of integration can be achieved by adjusting the sizes and shapes of the LED cells.

The AC driven light emitting device includes a first external electrode P1 and a second external electrode P2. The first external electrode P1 is connected with a first electrode of the first first LED cell A1 and a second electrode of the first second LED cell B1. The second external electrode P2 is connected with a second electrode of the third first LED cell A3 and a first electrode of the third second LED cell B3.

As shown in FIG. 2, the first external electrode P1 may be placed on the first first LED cell A1, and the second external electrode P2 may be placed on the third second LED cell B3. Compared to other LED cells, the extending LED cells A1 and B3 are more advantageous by having greater light-emitting areas. Therefore, areas for the first and second external electrodes P1 and P2 can be easily ensured in the extending LED cells A1 and B3, respectively. The first to third LED cells may have almost the same light-emission area to prevent concentration of current on a specific cell.

The term "light-emission area" used in this application means an area participating in light emission, and may be understood as an area of an active layer of each cell.

FIGS. 3A through 3D are side sectional views of the light emitting device of FIG. 2.

The first to third LED cells of the AC driven light emitting device according to this embodiment may be obtained from a first conductivity type semiconductor layer 34, an active layer 35, and a second conductivity type semiconductor layer 36 sequentially grown on the substrate 31. That is, the first conductivity type semiconductor layer 34, the active layer 35 and the second conductivity type semiconductor layer 36 are grown on the entire top surface of the substrate 31 for a light emitting structure. Thereafter, a resulting structure is isolated in units of cells, using a proper isolation process, thereby obtaining the arrangement of a plurality of first to third LED cells illustrated in FIG. 1.

FIGS. 3A through 3D are side sectional views of the light emitting device of FIG. 2, illustrating isolation of each cell unit, which may be preferably employed. The structure illustrated in FIG. 2 will now be described in more detail with reference to FIGS. 3A through 3D.

Figure 3A:
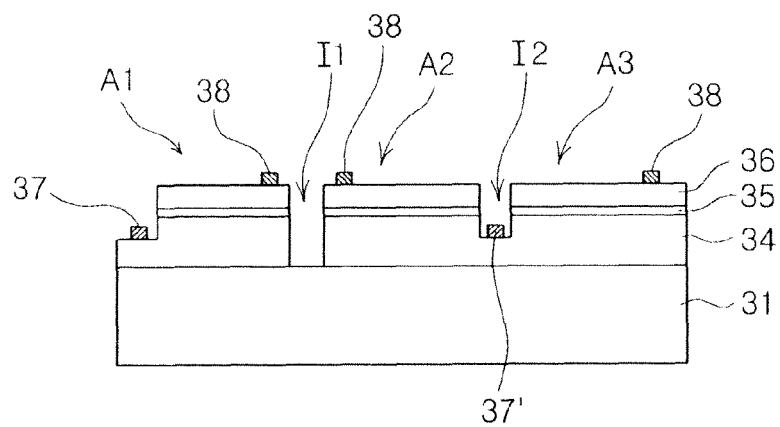
FIGS. 3A through 3D are side sectional views of the light emitting device of FIG. 2.

FIG. 3A is a cross-sectional view taken along line X1-X1' of the light emitting device of FIG. 2.

Referring to FIG. 3A, the first first LED cell A1 and the second first LED cell A2 are isolated from each other by a full-isolation process I1 for exposing a substrate region, whereas the second first LED cell A2 and the third first LED cell A3 may be separated by a half-isolation process 12 for exposing a region of the first conductivity type semiconductor layer 34. The second first LED cell A2 and the third first LED cell A3 may share the first electrode 37' disposed in the exposed region of the first conductivity type semiconductor layer 34.

The half-isolation process is partially performed within a range allowing the implementation of a desired driving circuit, and the first electrode 37' is disposed in the exposed region of the first conductivity type semiconductor layer 34. In such a manner, an electrode shared by adjacent cells is provided, so that the process can be simplified and the degree of integration can be improved.

Figure 3B:
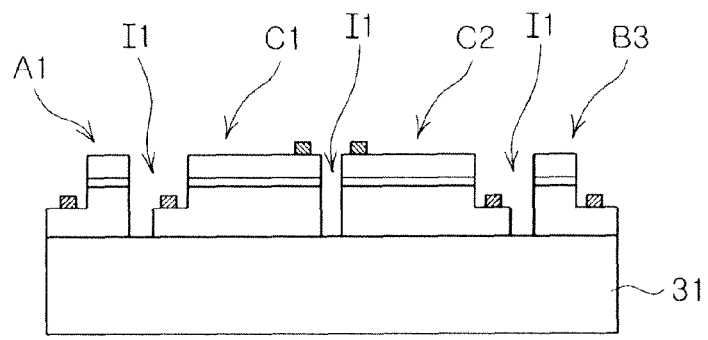

FIG. 3B is a cross-sectional view taken along line X2-X2' of the light emitting device of FIG. 2.

As shown in FIG. 3B, the first first LED cell A1 and the third second LED cell B3 are isolated from the third LED cells C1 and C2 by the full-isolation process I1, and the second LED cells B1 and B2 are isolated from each other by the full-isolation process I1.

Figure 3C:
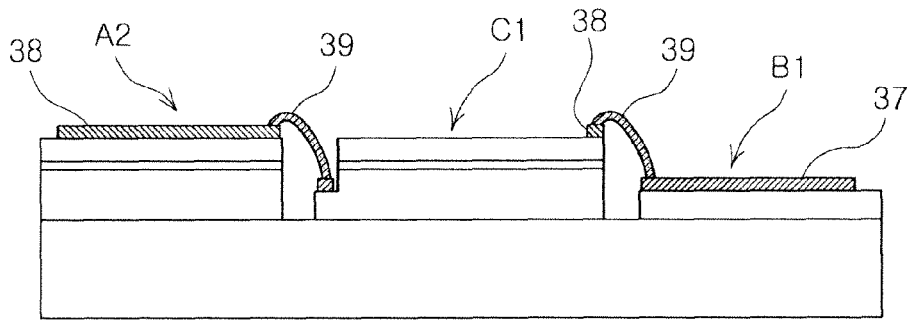

FIG. 3C is a cross-sectional view taken along line Y1-Y1' of the light emitting device of FIG. 2.

As shown in FIG. 3C, the first LED cell A2, the second LED cell B1 and the third LED cell C1 are isolated from each other by the full-isolation process I1. Lines 39 between electrodes of the cells may be configured by air bridges or wires as described above.

Figure 3D:
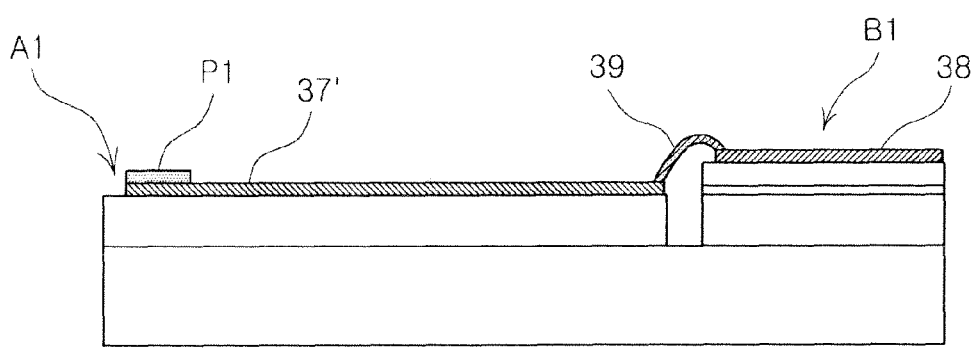

FIG. 3D is a cross-sectional view taken along line Y2-Y2' of the light emitting device of FIG. 2.

As shown in FIG. 3D, the first first LED cell A1 and the first second LED cell B1 are isolated from each other by the full-isolation process I1. The isolation and connection of the third first and second LED cells A2 and B3 may be understood in the similar manner.

Of course, unlike this embodiment, all the first to third LED cells may be isolated from other adjacent LED cells by exposing regions of the substrate 31, i.e., by the full-isolation process. Each cell may have individual first and second electrodes without sharing them.

As shown in FIG. 2, the third LED cell C1/C2 may be arranged adjacent to the two first LED cells A1 and A2/A2 and A3 having connected electrodes and the two second LED cells B1 and B2/B2 and B3 having connected electrodes. This can increase the degree of integration and shorten lines used for the electrode connection between the LED cells.

As shown in FIG. 2, each of the third LED cells C1 and C2 may have a top surface with a parallelogram shape inclined with respect to an arrangement direction thereof. The first and second electrodes 37 and 38 of each of the third LED cells C1 and C2 may be disposed adjacent to both inclined sides on a top surface of a corresponding one of the third LED cells C1 and C2. This design of the third LED cells C1 and C2 can contribute to further shortening the lines used for the electrode connection and thus reducing defects that may be caused during a line formation process and unfavorable shadow effect of long non-transparent line on emission efficiency.

To simplify the line connections, the first and second electrodes 37 and 38 of each of the first LED cells A1, A2 and A3 may be disposed adjacent to both sides on a top surface of a corresponding one of the first LED cells A1, A2 and A3, which are perpendicular to the arrangement direction of the corresponding first LED cell. The first and second electrodes 37 and 38 of each of the second LED cells B1, B2 and B3 may be disposed adjacent to both sides on a top surface of a corresponding one of the second LED cells B1, B2 and B3, which are perpendicular to the arrangement direction of the corresponding second LED cell.

Such arrangement may be variously implemented. For example, arrangement may be made as illustrated in FIG. 4 without being limited to the one illustrated in FIG. 2.

Figure 4:
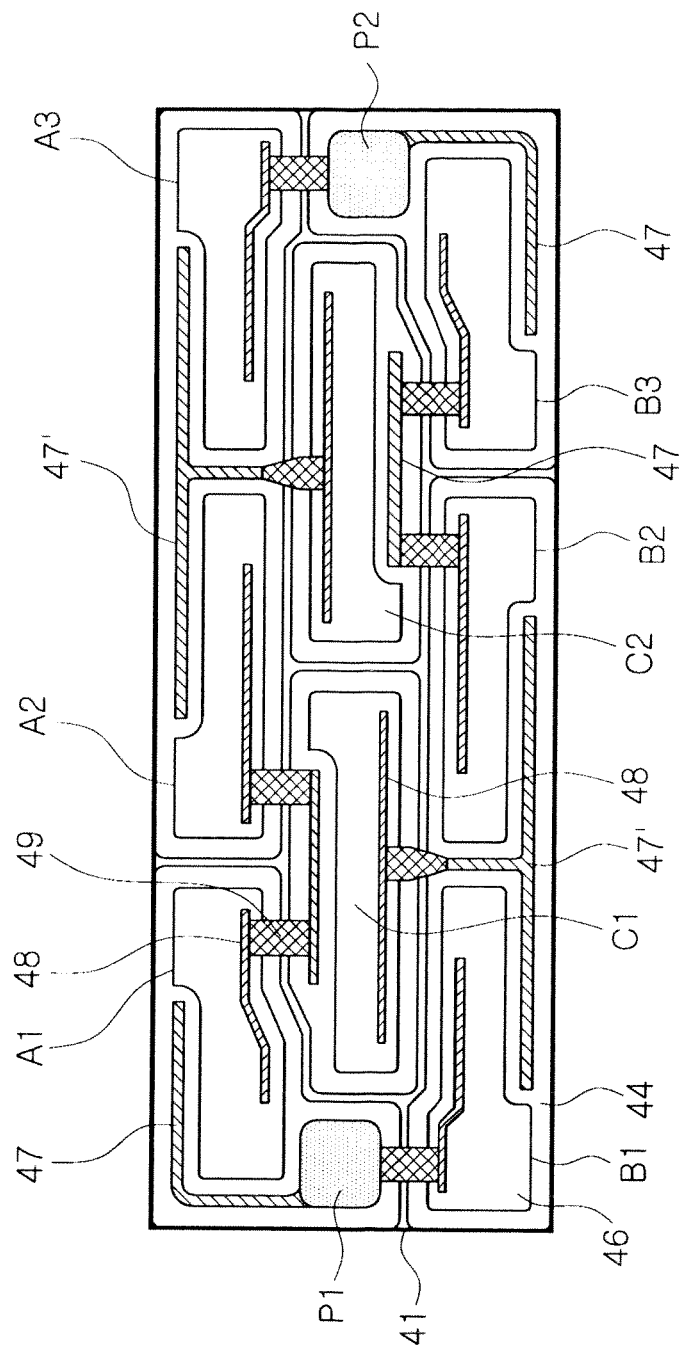
FIG. 4 is a plan view of a light emitting device according to another exemplary embodiment of the present invention.

Similarly to the previous embodiment, a light emitting device of FIG. 4 may have a structure obtained by sequentially forming a first conductivity type semiconductor layer 44, an active layer (not shown) and a second conductivity type semiconductor layer 46 on a substrate, and then isolating a resulting structure in proper units of cells. The structure obtained by the cell-unit isolation process may be understood as a structure similar to that described with reference to FIGS. 3A through 3D.

According to this embodiment, the third LED cells C1 and C2 each have a top surface having a rough rectangular shape with two longer sides and two shorter sides. Of course, this infers that each of the third LED cells C1 and C2 may also have an exact rectangular shape, not just the partially transformed rough rectangular shape, for a higher degree of integration.

According to this embodiment, the first and second electrodes 47 and 48 of each of the third LED cells C1 and C2 may be disposed adjacent to two longer sides of the rectangular top surface thereof.

In this case, the third LED cells C1 and C2 may be arranged such that their longer sides become roughly perpendicular to the arrangement direction of the third LED cells C1 and C2.

First and second electrodes 47 and 48 of each of the first LED cells A1 to A3 may be respectively disposed adjacent to both sides of a top surface of a corresponding one of the first LED cell A1 to A3, which are parallel to the arrangement direction of the first LED cells A1 to A3. The first and second electrodes 47 and 48 of each of the second LED cells B1 to B3 may be respectively disposed adjacent to both sides of a top surface of a corresponding one of the second LED cells B1 to B3, which are parallel to the arrangement direction of the second LED cells B1 to B3.

A light emitting device including three first LED cells, three second LED cells and two third LED cells has been described for the better understanding of the present invention. However, the present invention is not limited thereto and may be similarly applied to embodiments with more LED cells.

The present invention may be expressed as follows when the number of specific cells is not defined but generalized.

According to the present invention, an AC driven light emitting device includes K number of first LED cells, K number of second LED cells, and (K−1) number of third LED cells. Here, K is an integer satisfying K≥3. The first LED cells are arranged in a row, and the second LED cells are also arranged in a row. The third LED cells are disposed between the rows of the first and second LED cells. In this case, electrode connections between the first to third LED cells may be expressed as follows.

In the following description, respective sequences of the first to third LED cells are described as being arranged in one arrangement direction. The $m^{th}$ third LED cell has a first electrode connected with second electrodes of the $m^{th}$ and $m+1^{th}$ first LED cells, and a second electrode connected with first electrodes of the $m^{th}$ and $m+1^{th}$ second LED cells. Here, m is an odd number satisfying m<K. The $n^{th}$ third LED cell has a first electrode connected with second electrodes of the $n^{th}$ and $n+1^{th}$ second LED cells, and a second electrode connected with first electrodes of the $n^{th}$ and $n+1^{th}$ first LED cells. Here, n is an even number satisfying n<K.

A first electrode of the first first LED cell and a second electrode of the first second LED cell are connected together to form a contact to be provided as a first external electrode. Electrodes of the last $K^{th}$ first and second LED cells, which are not in connection with the third LED cell, are connected together to form a contact to be provided as a second external electrode.

The isolation described with reference to FIGS. 3A through 3D may be generalized as follows.

Every pair of the $m^{th}$ and $m+1^{th}$ second LED cells may be designed to be isolated from each other by an exposed region of a first conductivity type semiconductor layer and to share one first electrode disposed in the exposed region of the first conductivity type semiconductor layer. Similarly, every pair of the $n^{th}$ and $n+1^{th}$ first LED cells may be designed to be isolated by an exposed region of the first conductivity type semiconductor layer and to share one first electrode disposed in an exposed region of the first conductivity type semiconductor layer.

In this case, the remaining adjacent first to third LED cells may be isolated by the full-isolation process of exposing a region of a substrate.

Figure 5:
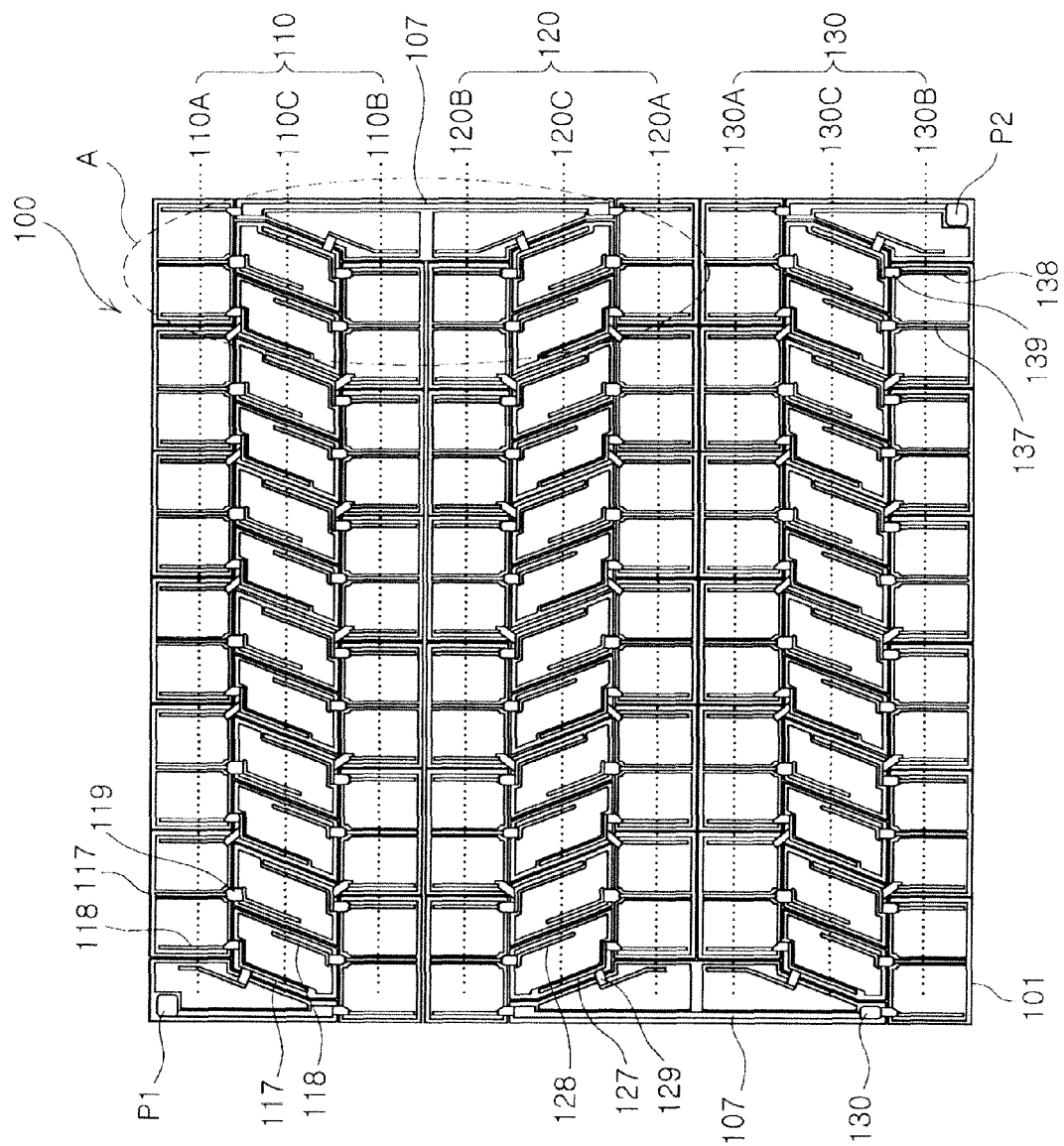
FIG. 5 is a plan view of a light emitting device according to a preferred exemplary embodiment of the present invention.
Figure 6:
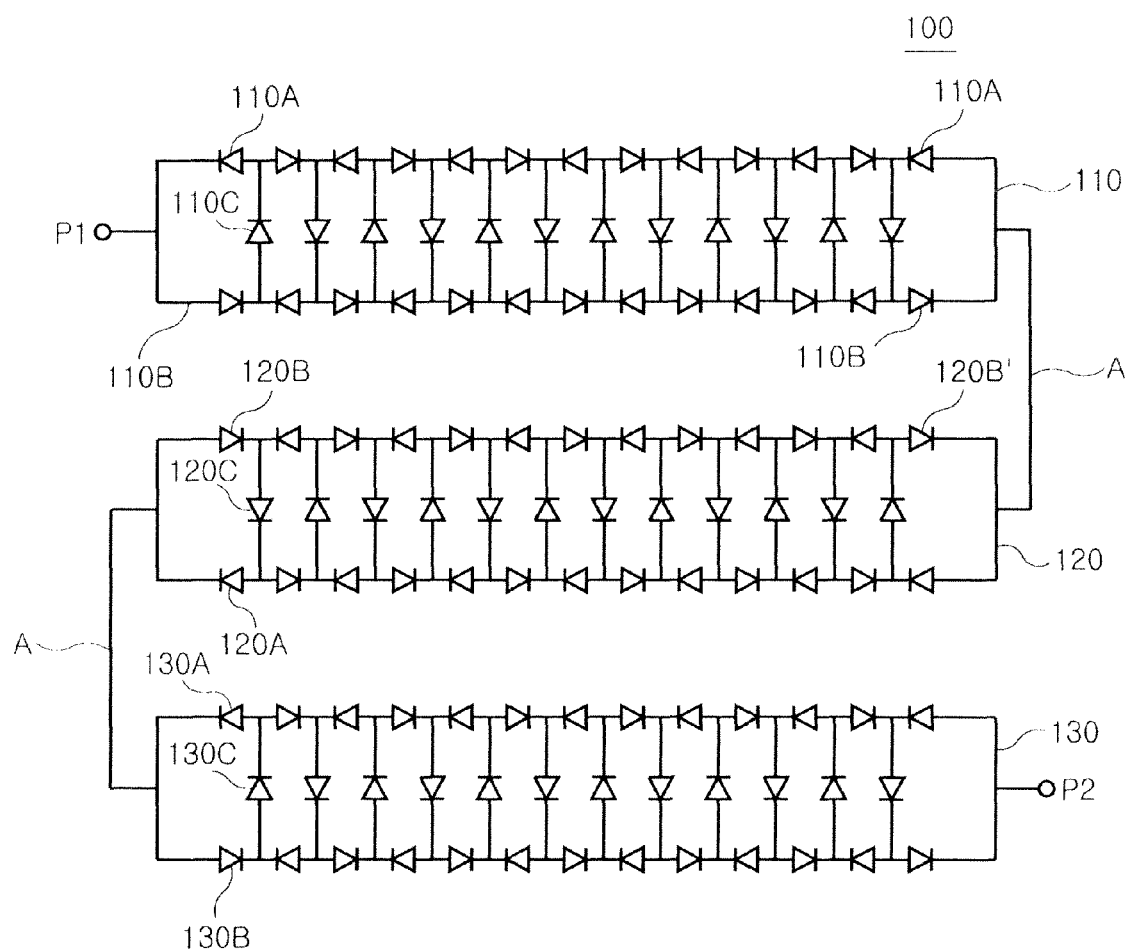
FIG. 6 is an equivalent circuit diagram of the light emitting device of FIG. 5.

FIG. 5 is a plan view of a light emitting device according to an exemplary embodiment of the present invention, and FIG. 6 is an equivalent circuit diagram of the light emitting device of FIG. 5.

A light emitting device 100 of FIG. 5 includes a substrate 101, and first to third ladder network circuit type LED arrays 110, 120 and 130 disposed parallel to one another on the substrate 101. LED cells of each of the first to third ladder network circuit type LED arrays 110, 120 and 130 are arranged from one side toward an opposing side (see dotted lines in FIG. 5).

The first ladder network circuit type LED array 110 includes thirteen first LED cells 110A, thirteen second LED cells 110B, and twelve third LED cells 110C. The first LED cells 110A are arranged in a row on a top surface of the substrate 101, and the second LED cells 110B are also arranged in a row on the top surface of the substrate 101. The third LED cells 110C are arranged in a row between the rows of the first and second LED cells 110A and 110B to be parallel thereto. The second ladder network circuit type LED array 120 includes thirteen first LED cells 120A, thirteen second LED cells 120B, and twelve third LED cells 120C. The first LED cells 120A are arranged in a row on a top surface of the substrate 101, and the second LED cells 120B are also arranged in a row on the top surface of the substrate 101. The third LED cells 120C are arranged in a row between the rows of the first and second LED cells 120A and 120B to be parallel thereto. The third ladder network circuit type LED array 130 includes thirteen first LED cells 130A, thirteen second LED cells 130B, and twelve third LED cells 130C. The first LED cells 130A are arranged in a row on a top surface of the substrate 101, and the second LED cells 130B are also arranged in a row on the top surface of the substrate 101. The third LED cells 130C are arranged in a row between the rows of the first and second LED cells 130A and 130B to be parallel thereto.

Each of the first to third ladder network circuit type LED arrays 110 to 130 has a connection structure between first to third LED cells for implementing a ladder network circuit. This connection structure may be implemented in a similar manner to that of the connection structure between the LED cells illustrated in FIG. 2.

For ease of the description of the connection between LED cells employed in this embodiment, respective sequences of the first to third LED cells are defined in one arrangement direction (here, in a direction from the right toward the left).

A first electrode 117 of the $m^{th}$ third LED cell 110C is connected with second electrodes 118 of the $m^{th}$ and $m+1^{th}$ first LED cells 110A. Here, m is an odd number satisfying m<13. A second electrode 118 of the $m^{th}$ third LED cell 110C is connected with first electrodes 117 of the $m^{th}$ and $m+1^{th}$ second LED cells 110B. This electrode connection is employed to the first to third ladder network circuit type LED arrays 110, 120 and 130 in the same manner.

A first electrode 117 of the $n^{th}$ third LED cell 110C is connected with second electrodes 118 of the $n^{th}$ and $n+1^{th}$ second LED cells 110B. Here, n is an even number satisfying n<13. A second electrode 118 of the $n^{th}$ third LED cell 110C is connected with first electrodes 117 of the $n^{th}$ and $n+1^{th}$ first LED cells 110A. This electrode connection is employed to the first to third ladder network circuit type LED arrays 110, 120 and 130 in the same manner.

A first electrode of the first first LED cell and a second electrode of the first second LED cell are connected with each other. Electrodes of the last first and second LED cells, which are not in connection with the third LED cell, are connected with each other. That is, a second electrode of the $13^{th}$ first LED cell and a first electrode of the $13^{th}$ second LED cell are connected with each other.

The above connections between the electrodes of the LED cells may be implemented by interconnection units 119, 129 and 139. For example, a known interconnection unit such as an air bridge or a wire may be used, but the present invention is not limited thereto.

As described so far, the details described with reference to FIGS. 2 and 3A through 3D may be incorporated with this embodiment if they do not depart from the teaching of this embodiment.

Figure 7A:
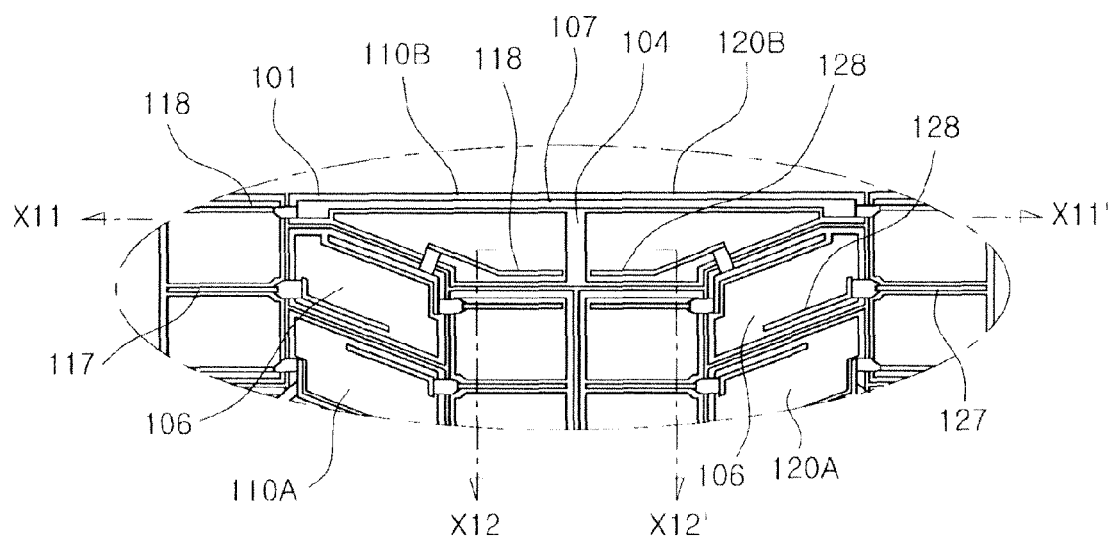
FIGS. 7A through 7C are a plan view and side sectional views of a connection portion of ladder network circuit rows of the light emitting device of FIG. 6.
Figure 7B:
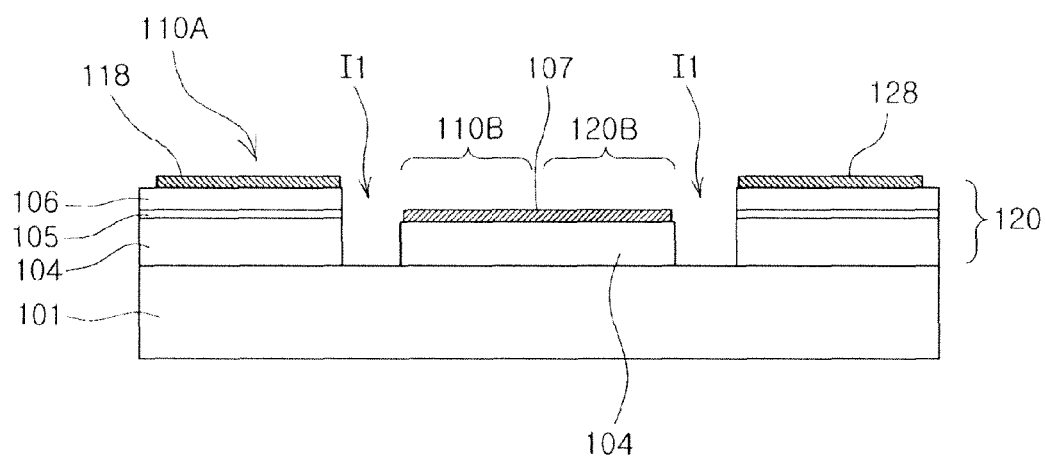
Figure 7C:
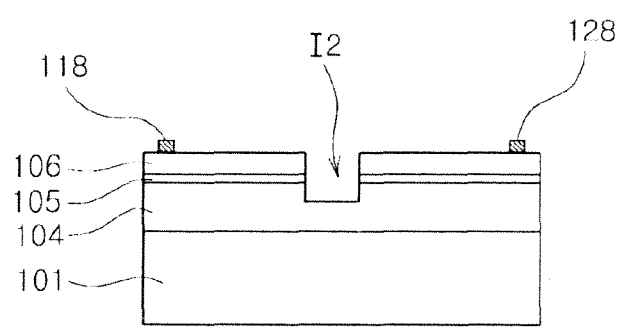

For example, the first to third LED cells each may be a structure obtained by separating a stack of a first conductivity type semiconductor layer 104, an active layer 105 and a second conductivity type semiconductor layer 106 sequentially grown on a substrate 101 using an appropriate isolation process (see FIGS. 7A through 7C). Also, the first and second LED cells may be isolated by the exposure only up to the first conductivity type semiconductor layer so that the first electrode may be shared in units of two adjacent cells (see FIG. 3A).

As shown in the drawings, the third LED cells 110C, 120C and 130C each may have a top surface having a parallelogram inclined with respect to its arrangement direction. In the third LED cells 110C, 120C and 130C, the first electrode 117, 127 or 137 and the second electrode 118, 128 or 138 may be respectively disposed adjacent to both inclined sides on a top surface of a corresponding one of the third LED cells 110C, 120C and 130C. The design of the third LED cells 110C, 120C and 130C may shorten the electrode interconnections.

Furthermore, to implement simpler interconnections, in the first LED cells 110A, 120A and 130A, the first electrode 117, 127 or 137 and the second electrode 118, 128 or 138 may be respectively disposed adjacent to both sides of a top surface of a corresponding one of the first LED cells 110A, 120A and 130A, which are perpendicular to the arrangement direction of the corresponding first LED cell. In the second LED cells 110C, 120C and 130C, the first electrode 117, 127 or 137 and the second electrode 118, 128 or 138 may be respectively disposed adjacent to both sides of a top surface of a corresponding one of the second LED cells 110C, 120C and 130C, which are perpendicular to an arrangement direction of the corresponding second LED cell.

According to this embodiment, the second ladder network circuit type LED array 120 is arranged to be placed between the first and second ladder network LED arrays 110 and 130.

The first and second ladder network circuit type LED arrays 110 and 120 are arranged such that the respective rows of the second LED cells 110B and 120B of the first and second ladder network circuit type LED arrays 110 and 120 are placed adjacent to each other. The second and third ladder network circuit type LED arrays 120 and 130 are arranged such that the respective rows of the first LED cells 120A and 130A thereof are placed adjacent to each other.

Through this arrangement, a connection between the ladder network circuits described below can be easily implemented. According to this embodiment, the second ladder network circuit type LED array 120 is electrically connected with adjacent first and third ladder network circuit type LED arrays 110 and 130 at both ends.

FIGS. 7A through 7C are a plan view and side sectional views illustrating a connection portion A of the light emitting device of FIG. 5.

An electrode of the $13^{th}$ second LED cell 110B of the first ladder network circuit type LED array 110, which is not in connection with the third LED cell 110C (i.e., the first electrode 117 in this embodiment) is connected with an electrode of the $13^{th}$ second LED cell 120B of the second ladder network circuit type LED array 120, which is not in connection with the third LED cell 120C (i.e., the first electrode 127 in this embodiment).

Similarly, an electrode of the first first LED cell 120A of the second ladder network circuit type LED array 120, which is not in connection with the third LED cell 110C (i.e., the first electrode 127 in this embodiment) is connected with an electrode of the $13^{th}$ first LED cell 130A of the second ladder network circuit type LED array 130, which is not in connection with the third LED cell 130C (i.e., the first electrode 137 of this embodiment).

According to this embodiment, a connection electrode between ladder network circuits is implemented in the form of a common electrode, thereby facilitating the connection between the ladder network circuits.

As shown in FIGS. 7A through 7C, the thirteenth second LED cell 110B of the first ladder network circuit type LED array 110 and the thirteenth second LED cell 120B of the second ladder network circuit type LED array 120 may be obtained using a half isolating process of exposing a region of the first conductivity type semiconductor layer 104 in a T shape when viewed from the top. A first common electrode 107 is disposed at a portion adjacent to one-side region of a substrate in the exposed region, so that two LED cells can share the first common electrode 107 and the aforementioned connection between the ladder network circuits can be realized.

Similarly, the first second LED cell 120B of the second ladder network circuit type LED array 120 and the first second LED cell 130B of the third ladder network circuit type LED array 130 may be obtained using a half-isolation process of exposing a region of the first conductivity type semiconductor layer 104 in a T shape when viewed from the top. A first common electrode 107 is disposed at a portion adjacent to one-side region of a substrate in the exposed region, so that two LED cells can share the first common electrode 107 and the aforementioned connection between the ladder network circuits can be realized.

Thus, the first through third ladder network circuits 110, 120 and 130, like an equivalent circuit illustrated in FIG. 6, are electrically connected in series to one another to implement an AC driven light emitting device having a configuration of a desired ladder network circuit.

According to this embodiment, the light emitting device with three ladder network circuit type LED arrays has been described. However, the present invention is not limited by the number of ladder network circuit type LED arrays. For example, a light emitting device may include just two ladder network circuit type LED arrays or four or more ladder network circuit type LED arrays. Of course, it is obvious to those skilled in the art that the number of LED cells belonging to each ladder network circuit type LED array is not limited to those illustrated in the accompanying drawings.

According to the present invention, an AC driven light emitting device is provided, which has an optimized ladder network circuit type connection structure for an operation at an AC to attain a high degree of integration. Particularly, AC driven light emitting devices of high productivity can be provided by arranging LED cells and placing and connecting electrodes so as to simplify the connection between the LED cells while ensuring high efficiency of each LED cell.

While the present invention has been shown and described in connection with the exemplary embodiments, it will be apparent to those skilled in the art that modifications and variations can be made without departing from the spirit and scope of the invention as defined by the appended claims.

What is claimed is:

1. An illumination apparatus, comprising:
a substrate;
K number of first LED cells arranged in a row on a top surface of the substrate, where K is an integer satisfying K≥3;
K number of second LED cells arranged in a row parallel to the row of the first LED cells on the top surface of the substrate;
(K−1) number of third LED cells arranged in a row between the respective rows of the first and second LED cells on the top surface of the substrate,
a first external electrode connected with a first electrode of a first one of the first LED cells and a second electrode of a first one of the second LED cells; and
a second external electrode connected with electrodes among electrodes of the $K^{th}$ first and second LED cells, which are not in connection with the third LED cell; and
first and second current loops each driven in each a half cycle of an alternating voltage applied between the first and second external electrodes, wherein:
the first current loop has (2r−1) sequence of the first LED cells, 2r sequence of the second LED cells and the (K−1) number of third LED cells, respectively to be connected in series; and the second current loop has 2r sequence of the first LED cells, (2r−1) sequence of the second LED cells and the (K−1) number of third LED cells, respectively to be connected in series, where r is a positive integer defining sequences of the respective first to third LED cells with respect to the first external electrode,
the first to third LED cells each comprise a first conductivity type semiconductor layer, an active layer and a second conductivity type semiconductor layer which are sequentially grown on the substrate, and
at least one adjacent pair of the first LED cells is isolated from each other by an exposed region of the first conductivity type semiconductor layer, and at least one adjacent pair of the first LED cells is isolated from each other by exposed regions of the substrate.

2. The illumination apparatus of claim 1, wherein a first electrode of the $(2r-1)^{th}$ third LED cell is connected with second electrodes of the $(2r-1)^{th}$ and $2r^{th}$ first LED cells, and a second electrode of the $(2r-1)^{th}$ third LED cell is connected with first electrodes of the $(2r-1)^{th}$ and $2r^{th}$ second LED cells,
a first electrode of the $2r^{th}$ third LED cell is connected with second electrodes of the $2r^{th}$ and $2r+1^{th}$ second LED cells, and a second electrode of the $2r^{th}$ third LED cell is connected with first electrodes of the $2r^{th}$ and $2r+1^{th}$ first LED cells.

3. The illumination apparatus of claim 2, wherein first and second electrodes of each of the first to third LED cells are respectively disposed adjacent to both facing sides on a top surface of a corresponding one of the first to third LED cells, and each have a portion extending along the corresponding side thereof.

4. The illumination apparatus of claim 3, wherein the substrate has a top surface having a rectangular shape with first to fourth sides, and
the first and second LED cells are respectively arranged in rows along the first and second sides, the first ones of the first and second LED cells are disposed adjacent to the third side, and the $K^{th}$ first and second LED cells are disposed adjacent to the fourth side.

5. The illumination apparatus of claim 4, wherein the first and second sides each have a longer length than the third and fourth sides.

6. The illumination apparatus of claim 5, wherein the third LED cell is arranged adjacent to two first LED cells having connected electrodes therebetween, and two second LED cells having connected electrodes therebetween.

7. The illumination apparatus of claim 6, wherein the third LED cell has a top surface with a parallelogram shape inclined with respect to an arrangement direction thereof.

8. The illumination apparatus of claim 7, wherein the first and second electrodes of the third LED cell are respectively disposed adjacent to both inclined sides on the top surface of the third LED cell.

9. The illumination apparatus of claim 8, wherein the first and second electrodes of the first LED cell are respectively disposed adjacent to both sides on the top surface of the first LED cell, which are perpendicular to an arrangement direction of the first LED cells, and the first and second electrodes of the second LED cell are respectively disposed adjacent to both sides on the top surface of the second LED cell, which are perpendicular to an arrangement direction of the second LED cells.

10. The illumination apparatus of claim 6, wherein the third LED cell has a top surface having a rough rectangular shape with two facing longer sides and two facing shorter sides.

11. The illumination apparatus of claim 10, wherein the first and second electrodes of the third LED cell are respectively disposed adjacent to the two longer sides of the top surface having the rectangular shape.

12. The illumination apparatus of claim 10, wherein the third LED cell is arranged such that the longer side thereof is almost perpendicular to an arrangement direction of the third LED cells, and
the first and second electrodes of the first LED cell are respectively disposed adjacent to both sides on the top surface of the first LED cell, which are parallel to the arrangement direction of the first LED cells, and the first and second electrodes of the second LED cell are disposed adjacent to both sides on the top surface of the second LED cell, which are parallel to the arrangement direction of the second LED cells.

13. The illumination apparatus of claim 12, wherein the first one of the first LED cells extends along the third side of the top surface of the substrate to be adjacent to the first one of the second LED cells, and
the $K^{th}$ second LED cell extends along the fourth side of the top surface of the substrate to be adjacent to the $K^{th}$ first LED cell.

14. The illumination apparatus of claim 13, wherein the first external electrode is placed on the first one of the first LED cells, and the second external electrode is placed on the $K^{th}$ second LED cell.

15. The illumination apparatus of claim 13, wherein the first to third LED cells have almost the same light emission areas.

16. The illumination apparatus of claim 1, wherein at least one pair of the $(2r-1)^{th}$ and $2r^{th}$ second LED cells is isolated from each other by an exposed region of the first conductivity type semiconductor layer, and shares one first electrode disposed in the exposed region of the first conductivity type semiconductor layer.

17. The illumination apparatus of claim 16, wherein said at least one adjacent pair of the first LED cells isolated from each other by the exposed region of the first conductivity type semiconductor layer shares one first electrode disposed in the exposed region of the first conductivity type semiconductor layer.

18. The illumination apparatus of claim 17, wherein every pair of the $(2r-1)^{th}$ and $2r^{th}$ second LED cells is isolated from each other by an exposed region of the first conductivity type semiconductor layer, and shares one first electrode disposed in the exposed region of the first conductivity type semiconductor layer.

* * * * *